United States Patent
El-Ghoroury et al.

(10) Patent No.: US 11,476,390 B2
(45) Date of Patent: Oct. 18, 2022

(54) III-V LIGHT EMITTING DEVICE WITH PIXELS ENABLING LOWER COST THROUGH-LAYER VIAS

(71) Applicant: Ostendo Technologies, Inc., Carlsbad, CA (US)

(72) Inventors: Hussein S. El-Ghoroury, Carlsbad, CA (US); Qian Fan, Carlsbad, CA (US); Kameshwar Yadavalli, Carlsbad, CA (US)

(73) Assignee: Ostendo Technologies, Inc., Carlsbad, CA (US)

( * ) Notice: Subject to any disclaimer, the term of this patent is extended or adjusted under 35 U.S.C. 154(b) by 0 days.

(21) Appl. No.: 17/161,571

(22) Filed: Jan. 28, 2021

(65) Prior Publication Data

US 2021/0242372 A1     Aug. 5, 2021

Related U.S. Application Data

(60) Provisional application No. 62/968,511, filed on Jan. 31, 2020.

(51) Int. Cl.
*H01L 33/30* (2010.01)
*H01L 27/15* (2006.01)
*H01L 33/62* (2010.01)

(52) U.S. Cl.
CPC ............ *H01L 33/30* (2013.01); *H01L 27/156* (2013.01); *H01L 33/62* (2013.01)

(58) Field of Classification Search
CPC combination set(s) only.
See application file for complete search history.

(56) References Cited

U.S. PATENT DOCUMENTS

| 7,623,560 | B2 | 11/2009 | El-Ghoroury et al. |
| 7,767,479 | B2 | 8/2010 | El-Ghoroury et al. |
| 7,829,902 | B2 | 11/2010 | El-Ghoroury et al. |
| 8,049,231 | B2 | 11/2011 | El-Ghoroury et al. |

(Continued)

FOREIGN PATENT DOCUMENTS

WO      2021155283      8/2021

OTHER PUBLICATIONS

International Search Report and Written Opinion for International Patent Application No. PCT/US21/15897, dated Jul. 13, 2021.

(Continued)

*Primary Examiner* — Ratisha Mehta
(74) *Attorney, Agent, or Firm* — Greg Caldwell, Esq.; W. Eric Boyd, Esq.

(57) ABSTRACT

A III-V light emitting device with pixels (mesa regions) specifically designed to enable lower cost through layer vias is disclosed for reduced cost of manufacture of the device. Reduction of cost of manufacture is achieved by having non-uniform width trench regions formed during pixel etch for the multi-pixel array part of the device. Through-layer vias are specifically formed in the wider part of the trench regions using cheaper lithography toolset enabled by the larger via critical dimension achievable in the wider part of the trench regions (as compared to narrow part of the trench regions). Larger via critical dimension enables improved electrical (and consequently optical) performance of the device due to better overlay control as well as lower via resistance.

12 Claims, 2 Drawing Sheets

(56) References Cited

U.S. PATENT DOCUMENTS

| | | |
|---|---|---|
| 8,098,265 B2 | 1/2012 | El-Ghoroury et al. |
| 8,243,770 B2 | 8/2012 | El-Ghoroury et al. |
| 8,567,960 B2 | 10/2013 | El-Ghoroury et al. |
| 2012/0033113 A1 | 2/2012 | El-Ghoroury et al. |
| 2016/0133795 A1 | 5/2016 | Usami |
| 2016/0359087 A1 | 12/2016 | Lee et al. |
| 2017/0358562 A1 | 12/2017 | Banna et al. |
| 2019/0355786 A1* | 11/2019 | Iguchi .................. H01S 5/0425 |
| 2021/0118946 A1* | 4/2021 | Simon .................. H01L 25/167 |

OTHER PUBLICATIONS

International Preliminary Report on Patentability for International Patent Application No. PCT/US21/15897, dated Aug. 11, 2022, 8 pages.

* cited by examiner

III-V LIGHT EMITTING DEVICE WITH PIXELS ENABLING LOWER COST THROUGH-LAYER VIAS

CLAIM OF PRIORITY

This nonprovisional patent application claims priority to provisional patent application, No. 62/968,511, filed Jan. 31, 2020, entitled "III-V LIGHT EMITTING DEVICE WITH PIXELS ENABLING LOWER COST THROUGH-LAYER VIAS", the contents of which are incorporated herein by reference.

TECHNICAL FIELD

Embodiments of the invention relate generally to light emitting devices (LED) and structures. More particularly, embodiments of the invention relate to a III-V material light emitting device (LED) and structure comprising one or more vertically stacked LED array layers on a complementary metal-oxide-semiconductor (CMOS) or thin film transistor (TFT) substrate with electrical connection vias from the CMOS/TFT substrate to be routed through the vertically stacked LED layers.

BACKGROUND

Three-dimensional or "3D" semiconductor integration enables improved performance of semiconductor integrated circuits (ICs) and enables increased functionality on Si-based IC platforms via the heterogeneous integration of different material layers (see e.g., G. Q. Zhang & A. J. van Roosmalen, "More than Moore: Creating High Value Micro/Nanoelectronics Systems", Springer). A non-limiting example of such a device is a CMOS/III-V integrated 3D micro-LED array emissive device referred to as a "Quantum Photonic Imager" display device or "QPI®" display device.

This new class of emissive micro-scale pixel array imager devices is disclosed in, for instance, U.S. Pat. Nos. 7,623,560, 7,767,479, 7,829,902, 8,049,231, 8,243,770, 8,567,960, and 8,098,265, the disclosures of which are incorporated herein by reference.

These QPI® display devices desirably feature high brightness, very fast multi-color light intensity and spatial modulation capabilities all in a very small device size that includes image processing control circuitry. The solid state light (SSL) emitting pixels of these devices may be either a light emitting diode (LED) or a laser diode (LD), or both, which device's on-off state is controlled by control circuitry contained within a complementary metal-oxide-semiconductor (CMOS) controller chip (or device) upon which the emissive micro-scale pixel array of the QPI® display imager is bonded and electronically coupled.

In an RGB QPI® display, multiple micro-LED array layers for Red (R), Green (G) and Blue (B) emission are vertically stacked with very high alignment accuracy on top of a CMOS substrate to enable RGB emission from the same pixel aperture. Within a single micro-LED array layer, the constituent micro-LEDs are separated by etched trenches between the micro-LEDs and electrical and optical isolation is achieved using deposition of passivation layers. Through-layer connectivity is achieved by utilization of within-trench metal structures isolated by passivation layers from photonic micro-LEDs.

The size of the pixels comprising the QPI® displays may be in the range of approximately 5-20 microns with a typical chip-level emissive surface area being in the range of approximately 15-150 square millimeters. The pixels of the above emissive micro-scale pixel array display devices are individually addressable spatially, chromatically and temporally through the drive circuitry of its CMOS controller chip. The brightness of the light generated by such imager devices can reach multiple 100,000 cd/m$^2$ at reasonably low power consumption.

In a digitally addressable micro-LED device such as a QPI® display device, low resistance electrical vias from the CMOS controller chip are routed to both p and n surfaces (to their contacts) of each of the constituted micro-LED color array layer diodes. In a high resolution, high brightness and high efficiency display device like the QPI® display device, maximizing the micro-LED array individual pixel mesa area (or simply "mesa area") and the emission aperture area are important. However, since establishing low resistance through-layer electrical connection is essential to enable electrical operation of such a highly integrated 3D-IC structure there is a trade-off between mesa area and trench critical dimensions (CDs).

Another important factor that comes into play is the ability to fabricate such a display chip at a reasonable cost. A 3D-IC like the QPI® display device consists of a Si CMOS IC that is typically fabricated in a CMOS foundry, and on top of which the photonic pixel array layers are transferred after processing of the photonic wafers. The processing of the photonic layers and the integration of the photonic layers with Si CMOS IC may happen in a different foundry with different technology node tool-set. A critical factor impacting cost in any semiconductor process is the lithography technology utilized and electrical vias have some of the smallest CDs in a 3D-IC like the QPI® display device (for the non-CMOS part of the IC).

Accordingly, what is needed for the optimum cost of fabrication of a vertically stacked micro-LED device, such as a QPI® display device, are fabrication methods, processes and device structures that enable overall device electrical and optical performance with usage of a lower cost foundry toolset. In this regard, LED array pixel mesa shaping to enable slightly larger through-layer electrical vias (at the expense of maximized mesa area) is proposed for cost reduction, according to embodiments of the invention. Modifications in the mesa pixel area, such as cutouts in the pixel mesa area are proposed enabling locally wider trench regions between pixels for lower cost via formation. Such cutouts can be implemented on any pixel form (circular, triangular, square and hexagonal shaped areas among others). Pixel form is the 2D shape (top view or surface area geometry) of the fabricated pixel, for example, an etched pixel. The etched pixel sidewall can be straight (parallel) or angular, in relation to a direction that is perpendicular to the plane of the top surface of the pixel form, hereinafter referred to as the vertical direction.

BRIEF DESCRIPTION OF THE DRAWINGS

Embodiments of the invention are illustrated by way of example and not limitation in the figures of the accompanying pictures in which like references indicate similar elements.

The matters defined in the description, such as detailed construction and elements are provided to assist in an understanding of the exemplary embodiments. However, the present invention can be practiced without such specifically-defined matters. Also, well-known functions or constructions are not described in detail to avoid possibly obscuring embodiments of the invention with unnecessary detail. In order to understand the embodiments of the invention and to understand how the embodiments may be carried out in practice, a few embodiments will now be described, by way of non-limiting examples only, with reference to the accompanying drawings, in which.

DETAILED DESCRIPTION

Various embodiments and aspects of the invention will be described with reference to details discussed below, and the accompanying drawings will illustrate the various embodiments. The following description and drawings are illustrative of embodiments of the invention and are not to be construed as limiting the disclosure of such. Numerous specific details are described to provide a thorough understanding of various embodiments of the present invention. However, in certain instances, well-known or conventional details are not described in order to provide a concise discussion of embodiments of the invention.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the invention are applicable to the field of III-V material based devices in general (such as laser diodes (LDs), light emitting diodes (LEDs), micro-LEDs for example) and to CMOS integrated micro-LED array light emissive devices in particular. Disclosed are cost-effective fabrication methods for realizing such devices by the incorporation of cutouts in the pixels, enabling fabrication of through-layer interconnects using less expensive lithography toolsets.

In some embodiments, the shape of the pixel enables the ability to optimize the top light emission and extraction area while allowing for a locally wider trench region in between pixels for low resistive through-layer via formation.

Chip shaping and (to a lesser extent) pixel shaping are common techniques that are utilized in III-V devices field to enable higher efficiency light emission and for optimizing the light emission profile (relative to targeted applications). In the prior art, chip shaping and pixel shaping are primarily used to change the vertical sidewall profile of the light emitting diode structures (mesa structures) to enable emitted light re-direction towards an aperture for increasing the emission of light from the fabricated structure. In flip-chip LEDs, the backside sapphire substrate may be shaped to enable increased light emission. In a different application (holographic recording), pixels which are part of a data page are shaped to have different area, keeping the same shape.

Figure 1:
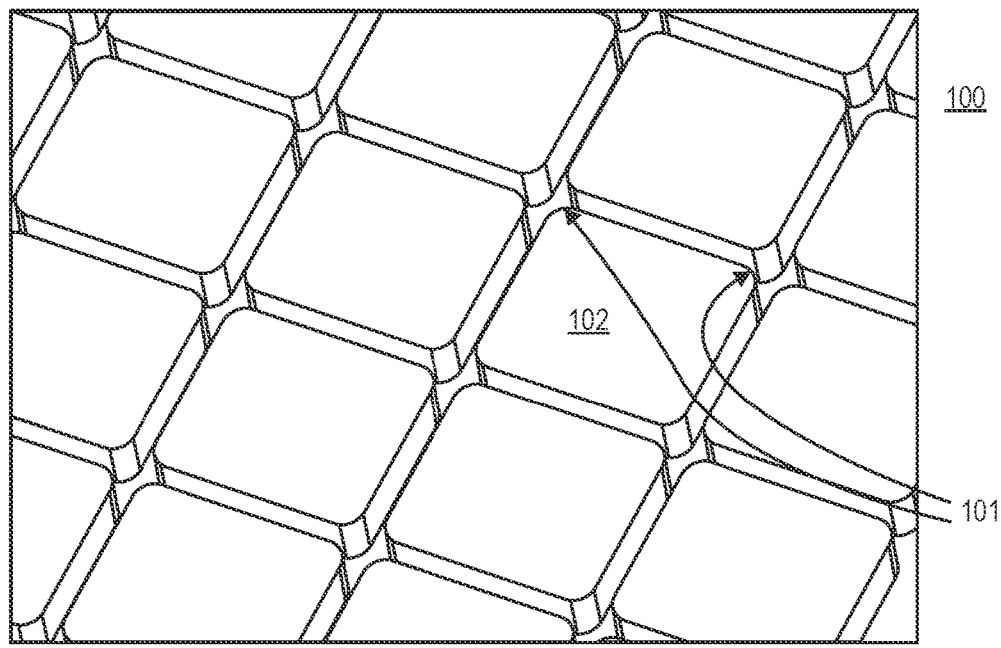
FIG. 1 is a line drawing (rotated and tilted view) of pixels in a III-V material (p-side up) showing prior-art square shaped pixels with uniform trench width on all sides of the pixels according to one prior-art embodiment.

Micro-LED array devices based on III-V materials have been extensively studied in the last two decades. Typically, in the prior-art, uniform arrays of devices are fabricated with trenches etched between mesas. Typically micro-LEDs are either circular or square shaped (referring to a 2D shape in a horizontal plane at the base or top of the micro-LED). For typical square-shaped micro-LED arrays the trenches between micro-LED mesas are uniform in width (see FIG. 1 for line drawing of such an array 100, where the rounding at the corners (e.g., corners 101) of the square shaped pixels (e.g., square shaped pixel 102) is a consequence of lithography and etch processes).

When micro-LEDs are vertically stacked to enable RGB light emission from a single aperture (as in the case of QPI® display devices), enabling through-layer via connections to higher layer micro-LEDs through micro-LED layers below provides for signal routing. In a QPI® display device, for example, electrical signal, power and ground paths are routed vertically through the vertical stack of light emitting layers comprising arrays of micro-LEDs by means of metal traces and through-layer vias to enable the individual control of light emission from the respective layers. Typically, the emission area of the micro-LEDs is maximized for brightness, but there is a tradeoff with respect to area of the trenches allowed through which via connections are to be established. In a typical wafer foundry, the lithography related toolset incurs the most cost, and lithography processes are typically the more common steps in chip fabrication flow.

To enable cost-effective via fabrication, non-uniform width of the inter-pixel (inter-mesa) trench regions in a micro-LED array is proposed to enable wider trench areas where larger critical dimensions (CD) through-layer via connections are preferentially fabricated, according to embodiments of the invention. Larger CD vias enable lower via electrical resistance as well as improved overlay accuracy leading to improved electrical and optical performance of the device.

Figure 2:
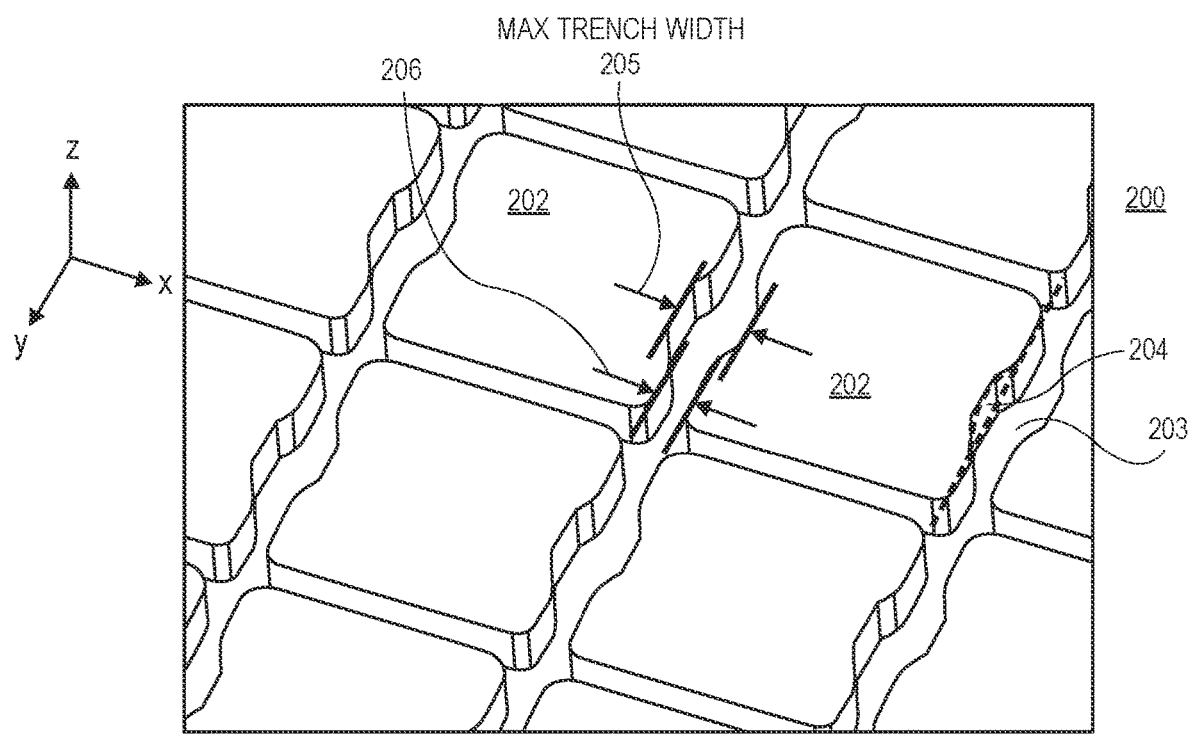
FIG. 2 is a line drawing (rotated and tilted view) of pixels in a III-V material (p-side up) showing cutouts in pixels in one direction enabling wider trench regions for later fabrication of larger CD through-layer vias according to one embodiment.

To address the concerns of cost in the fabrication of a vertically stacked multi-layer micro-LED array device, in one aspect, a micro-LED array light emitting device is disclosed (an exemplar embodiment 200 is shown in FIG. 2) and may comprise a plurality of single or multi-layer etched micro-LEDs (e.g., micro-LED 202), arranged in a 2D grid, wherein the trench regions 203 between the micro-LEDs have non-uniform widths with wider trench regions (achieved by cutouts 204 in micro-LED mesas) which will be utilized for fabrication of through-layer via connections. In the embodiment shown in FIG. 2, the cutouts 204 in micro-LED mesas are in one direction only—the x-axis direction with reference to the top view, i.e., the left and right sides of the micro-LED mesas as viewed from the top in FIG. 2. In another embodiment, the cutouts in micro-LED mesas may be in the y-axis direction only, i.e., the top and bottom sides of the micro-LED mesas as viewed from the top (not shown in FIG. 2).

Figure 3:
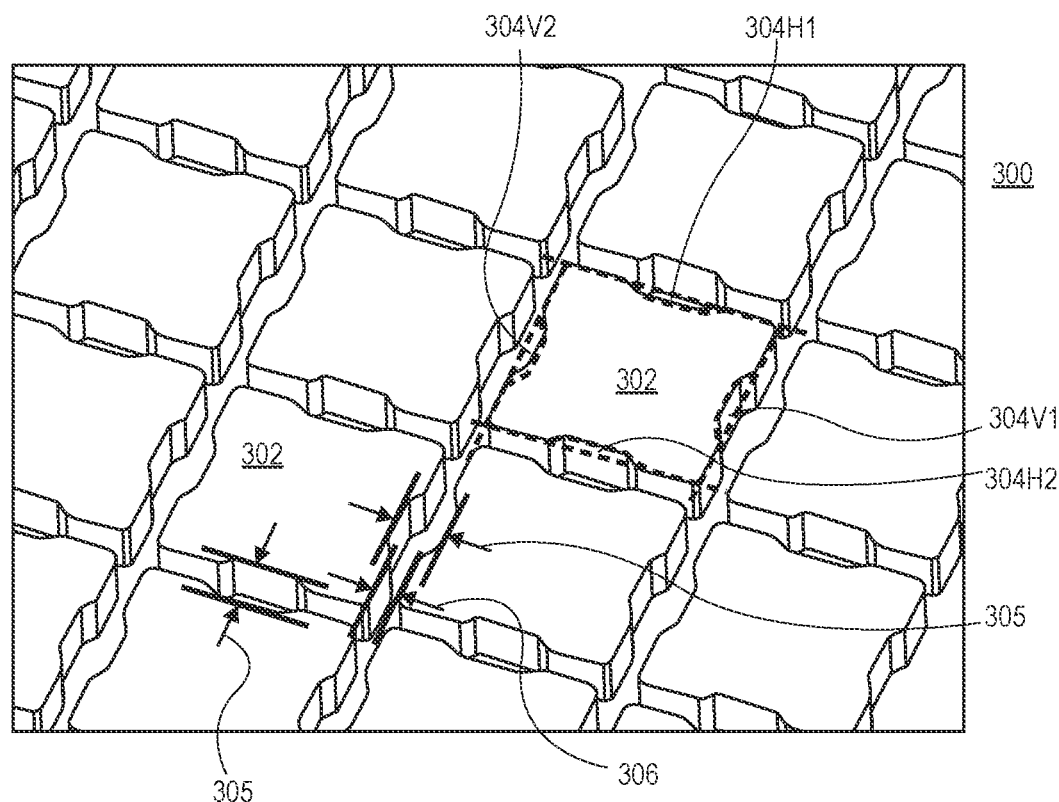
FIG. 3 is a line drawing (rotated and tilted view) of pixels in a III-V material (p-side up) showing cutouts in pixels in two directions enabling wider trench regions for later fabrication of larger CD through-layer vias according to one embodiment.

In one embodiment 300, the cutouts in micro-LED mesas may be in both x-axis and y-axis directions (e.g., cutouts 304H1 or 304H2 and cutouts 304V1 or 304V2; respectively, as seen on a top view of the micro-LED mesa 302), an exemplar embodiment 300 of which is shown in FIG. 3.

In one embodiment, the cutouts in the micro-LED mesa may be on both sides of a mesa for a given direction, e.g., x-axis cutouts 304H1 and 304H2 and/or y-axis cutouts 304V1 and 304V2, as seen on a top view of the micro-LED mesa 302 in the embodiment 300 shown in FIG. 3.

In one embodiment, the cutouts in the micro-LED mesa may be only on one side of the mesa for a given direction, e.g., only x-axis cutout 304H1 or 304H2 but not both, and/or only y-axis cutout 304V1 or 304V2 but not both, as seen on a top view of the micro-LED mesa 302 in the embodiment 300 shown in FIG. 3.

In embodiments, for example, embodiments 200, 300 or 400, the cutouts in the micro-LED mesas may be achieved by gradual or linear (e.g., FIG. 4), or non-linear (e.g., FIGS. 2 and 3), variation of the inter-mesa trench width leading to a maximum trench width 205, 305, 405 somewhere along the sides of two respective adjacent mesas 202, 302, 402 where the cutout is implemented on at least one side of one of the respective adjacent mesas. As can be seen in the embodiments, the maximum trench width 202, 302, 402 is greater than a respective minimum trench width 206, 306, 406.

Figure 4:
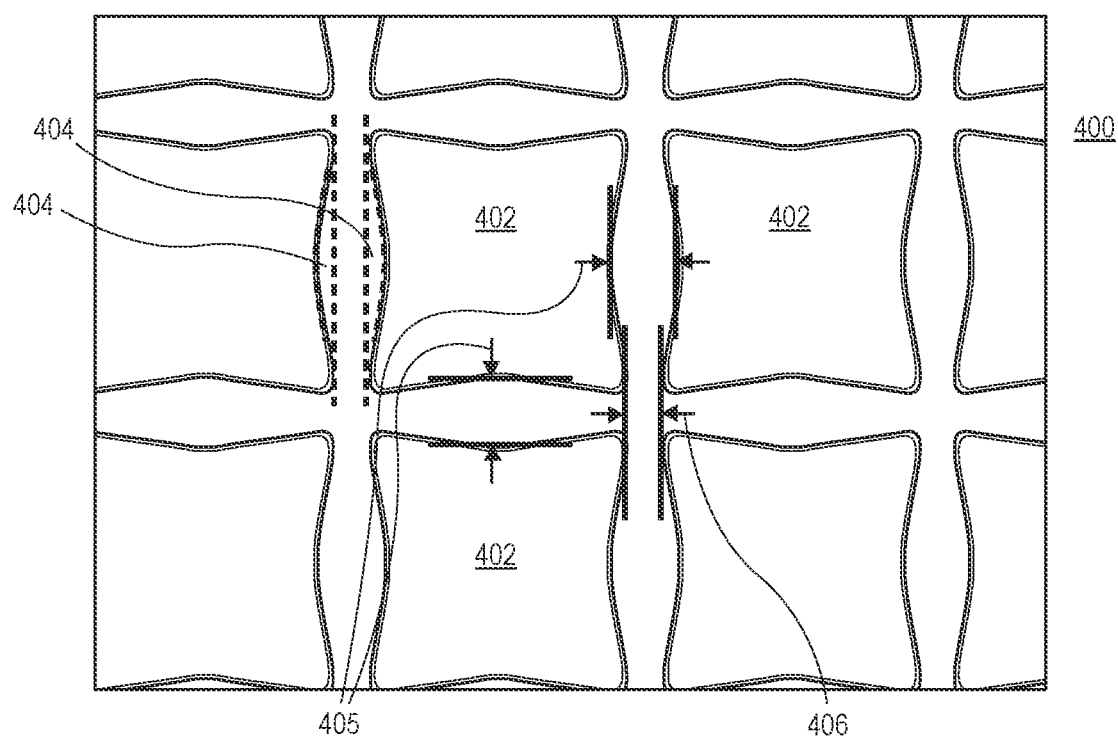
FIG. 4 is a line drawing (top view) of pixels in a III-V material (p-side up) showing cutouts in pixels in two directions enabling wider trench regions for enabling later fabrication of larger CD through-layer vias, according to another embodiment.

In one embodiment, the cutouts (e.g., cutouts 404) in the micro-LED mesas (e.g., mesas 402) may be achieved by gradual or linear variation of the inter-mesa trench width leading to a maximum trench width 405 at or close to the middle of a side of the mesa 402 where the cutout is implemented as shown in embodiment 400 in FIG. 4). Compared for cutouts 204, 304V1, 304V2, 304H1, 304H2 in FIGS. 2 and 3, the cutouts 404 in the FIG. 4 enable gradual change of a pixel's top surface profile.

In one embodiment of a vertically stacked multi-layer micro-LED array device, the design of the cutouts in the mesas is similar for all the micro-LED array layers. As an example, multiple of the same micro-LED array layers 200, 300, or 400, for Red (R), Green (G) and Blue (B) emission may be vertically stacked with very high alignment accuracy on top of a CMOS substrate to enable RGB emission from the same pixel aperture. Each micro-LED array layer is designed with the same cutouts in the mesas, with the constituent micro-LEDs in each array layer separated by etched trench regions between the micro-LEDs that have the same non-uniform widths with wider trench regions achieved by cutouts in micro-LED mesas between the micro-LEDs, and electrical and optical isolation is achieved using deposition of passivation layers. Through-layer connectivity is achieved by utilization of within-trench metal structures isolated by passivation layers from photonic micro-LEDs.

In one embodiment of a vertically stacked multi-layer micro-LED array device, the design of the cutouts in the mesas is the same, or different, for each of the micro-LED array layers. As an example, a mix of micro-LED array layers selected from embodiments 200, 300, or 400, for Red (R), Green (G) and Blue (B) emission may be vertically stacked with very high alignment accuracy on top of a CMOS substrate to enable RGB emission from the same pixel aperture. Each micro-LED array layer is designed with the same, or different cutouts, in the mesas, relative to micro-LED array layers above or below, with the constituent micro-LEDs in each array layer separated by etched trench regions between the micro-LEDs that have the same or different non-uniform widths as the micro-LEDs in array layers above or below, with wider trench regions achieved by cutouts in micro-LED mesas between the micro-LEDs, and electrical and optical isolation is achieved using deposition of passivation layers. Through-layer connectivity is achieved by utilization of within-trench metal structures isolated by passivation layers from photonic micro-LEDs. In one embodiment, the first, or lowermost micro-LED array layer that is closest to a control logic layer (control circuitry (analog, digital or mixed signal logic achieved using either CMOS or TFTs) within a complementary metal-oxide-semiconductor (CMOS) controller chip (or device) upon which the micro-LED array layer is bonded and electronically coupled) may have mesa cutouts on all four sides, such as cutouts 304V1, 304V2, 304H1 and 304H2 as in embodiment 300, while the second micro-LED array layer may have mesa cutouts on less than all four sides. For example, just two sides of the second micro-LED array layer may have mesa cutouts—such as the cutouts 204 depicted on opposite sides of each micro-LED mesa in FIG 2. In alternative embodiments, the second micro-LED array layer may have mesa cutouts on two connecting sides of each micro-LED mesa, or a single side, or any combinations thereof. According to an embodiment, a third, or uppermost micro-LED array layer that is farthest from the control logic layer (or simply control layer) may have no mesas with no cutouts (e.g., mesa 102) since there is no need for wider vias to support any micro-LED array layers above the uppermost micro-LED array layer.

As suggested above, in one embodiment of a vertically stacked multi-layer micro-LED array device, the number of cutouts in the mesas is higher, or the size of the cutouts is greater, for a first or lower micro-LED array layer closest to, or closer to, a control layer (analog, digital or mixed signal logic layer achieved using either CMOS or TFTs) compared to the number and/or size of cutouts in the mesas for a second or higher micro-LED array layer above the first micro-LED array layer. In one embodiment, the first, or lower micro-LED array layer that is closer to a control layer may have mesa cutouts on all four sides, such as in micro-LED mesa 300 in FIG. 3 (or micro-LED mesa 400 in FIG. 4), while the second micro-LED array layer may have mesa cutouts on less than all four sides, such as two cutouts 204 depicted on opposite sides of each micro-LED mesa 200 in FIG. 2.

In one embodiment of a vertically stacked multi-layer micro-LED array device, the number of cutouts in the mesas is highest for the micro-LED array layer closest to a control layer (analog, digital or mixed signal logic layer achieved using either CMOS or TFTs), while the number of cutouts in the mesas is lowest for the micro-LED array layer farthest from the control layer.

The device may comprise a plurality of stacked light emitting layers, with each layer comprising an array of etched micro-LED pixels (mesas), which are separately configured to each emit light of a different wavelength such as a red, green and blue light. The light emitting micro-LED array layers may be fabricated from epi structures using GaN/InGaN material system or AlInGaP based material system.

The light emitting device layer's mesas may be patterned using industry standard lithography tools and etched using industry standard etch tools and techniques.

Embodiments of the invention may be incorporated into digitally addressable micro-LED device such as a QPI® display device, wherein low resistance electrical vias from the CMOS controller chip are routed to both p and n surfaces (to their contacts) of each of the constituted micro-LED color array layer diodes for through-layer via connections to enable electrical signals to be routed from the bottom side of the light emitting layers to the top side of the light emitting layers through the non-uniform width trench regions between the fabricated pixels, with electrical connections from the control logic layer routed to the light emitting layer's pixel contacts. In a high resolution, high brightness and high efficiency display device like the QPI® display device, maximizing the micro-LED array individual pixel mesa area (or simply "mesa area") and the emission aperture area are important. However, since establishing low resistance through-layer electrical connection is essential to enable electrical operation of such a highly integrated 3D-IC structure there is a trade-off between mesa area and trench critical dimensions (CDs). Thus, the embodiments described above in which the number of cutouts in the mesas is higher, or the size of the cutouts is greater, for a first or lower micro-LED array layer closer or closest to, a control layer (analog, digital or mixed signal logic layer achieved using either CMOS or TFTs) compared to the number and/or size of cutouts in the mesas for a second or higher micro-LED array layer above the first micro-LED array layer.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by any claims that follow.

For example, notwithstanding the fact that the elements of such a claim may be set forth in a certain combination, it must be expressly understood that the invention includes other combinations of fewer, more or different elements, which are disclosed in above even when not initially claimed in such combinations.

The words used in this specification to describe various embodiments are to be understood not only in the sense of their commonly defined meanings, but to include by special definition in this specification structure, material or acts beyond the scope of the commonly defined meanings. Thus, if an element can be understood in the context of this specification as including more than one meaning, then its use in a subsequent claim must be understood as being generic to all possible meanings supported by the specification and by the word itself.

The definitions of the words or elements of any claims that follow should be, therefore, defined to include not only the combination of elements which are literally set forth, but all equivalent structure, material or acts for performing substantially the same function in substantially the same way to obtain substantially the same result. In this sense, it is therefore contemplated that an equivalent substitution of two or more elements may be made for any one of the elements in such claims below or that a single element may be substituted for two or more elements in such a claim.

Although elements may be described above as acting in certain combinations and even subsequently claimed as such, it is to be expressly understood that one or more elements from a claimed combination can in some cases be excised from the combination and that such claimed combination may be directed to a subcombination or variation of a subcombination.

Insubstantial changes from any subsequently claimed subject matter as viewed by a person with ordinary skill in the art, now known or later devised, are expressly contemplated as being equivalently within the scope of such claims. Therefore, obvious substitutions now or later known to one with ordinary skill in the art are defined to be within the scope of the defined elements.

Any claims in this application are thus to be understood to include what is specifically illustrated and described above, what is conceptually equivalent, what can be obviously substituted and also what essentially incorporates the essential idea of the disclosure.

What is claimed is:

1. A III-V light emitting device comprising:
   one or more vertically stacked light emitting layers, at least one of which comprises an array of fabricated pixels; and
   a plurality of through-layer via connections to enable electrical signals to be routed from a bottom side of the one or more vertically stacked light emitting layers to a top side of the one of or more vertically stacked light emitting layers through trench regions, which trench regions are a first width at a first point along a horizontal axis and a second width that is different than the first width at a second point along the horizontal axis that is different than the first point along the horizontal axis, between the array of fabricated pixels.

2. The III-V light emitting device of claim 1 wherein each fabricated pixel in the array of fabricated pixels comprises a mesa area, and wherein at least a portion of one side of the mesa area is cutout to create the second width at the second point of the trench region along the horizontal axis between the fabricated pixel and an adjacent fabricated pixel in the array of fabricated pixels.

3. The III-V light emitting device of claim 2 wherein the cutout in the at least the portion of the one side of the mesa area of each fabricated pixel is in both a horizontal and a vertical direction.

4. The III-V light emitting device of claim 2, wherein at least a portion of a second side of the mesa area of each fabricated pixel is cutout to create the second width at the second point of the trench region along the horizontal axis between the fabricated pixel and an adjacent fabricated pixel in the array of fabricated pixels.

5. The III-V light emitting device of claim 2 wherein the cutout in the at least the portion of the one side of the mesa area of each fabricated pixel provides a gradual variation of an inter-mesa trench width between the fabricated pixel and an adjacent fabricated pixel in the array of fabricated pixels leading to a maximum inter-mesa trench width at the second point in the one side of the mesa that is cutout.

6. The III-V light emitting device of claim 2 wherein the second point in the one side of the mesa that is cutout is substantially in a middle point of the one side of the mesa that is cutout.

7. The III-V light emitting device of claim 2 wherein the cutouts in the mesas is similar for all of the plurality of vertically stacked light emitting layers.

8. The III-V light emitting device of claim 2 where the cutouts in the mesas is different for at least one of the plurality of vertically stacked light emitting layers.

9. The III-V light emitting device of claim 1, further comprising:
   a control logic layer positioned adjacent a bottom side of the one or more vertically stacked light emitting layers to generate the electrical signals;
   wherein the at least one of the one or more vertically stacked light emitting layers that comprises an array of fabricated pixels having a p-side contact or an n-side contact or both; and
   wherein the plurality of through-layer via connections to enable the electrical signals generated by the control logic layer to be routed from the bottom side of the one or more vertically stacked light emitting layers to a top side of the one or more vertically stacked light emitting layers through the trench regions that are the second width that is different than the first width at the second point along the horizontal axis that is different than the first point along the horizontal axis between the array of fabricated pixels, to the p- or n-side contacts or both.

10. The III-V light emitting device of claim 2 wherein the cutouts in the mesas is different for each of the plurality of vertically stacked light emitting layers.

11. The III-V light emitting device of claim 9 wherein a number of cutouts in the mesas is higher for a light emitting layer closer to the control logic layer.

12. The III-V light emitting device of claim 9 where the number of cutouts in the mesas is highest for a light emitting layer closest to the control logic layer and the number of cutouts in the mesas is lowest for a light emitting layer farthest from the control logic layer.

* * * * *